United States Patent
Assali et al.

(10) Patent No.: US 9,493,890 B2
(45) Date of Patent: Nov. 15, 2016

(54) DIRECT BAND GAP WURTZITE SEMICONDUCTOR NANOWIRES

(71) Applicant: Technische Universiteit Eindhoven, Eindhoven (NL)

(72) Inventors: Simone Assali, Eindhoven (NL); Ilaria Zardo, Eindhoven (NL); Jozef Everardus Maria Haverkort, Vught (NL); Erik Petrus Antonius Maria Bakkers, Heeze (NL)

(73) Assignee: Technische Universiteit Eindhoven, Eindhoven (NL)

( * ) Notice: Subject to any disclaimer, the term of this patent is extended or adjusted under 35 U.S.C. 154(b) by 341 days.

(21) Appl. No.: 14/184,085

(22) Filed: Feb. 19, 2014

(65) Prior Publication Data
US 2014/0230720 A1 Aug. 21, 2014

Related U.S. Application Data

(60) Provisional application No. 61/766,421, filed on Feb. 19, 2013.

(51) Int. Cl.
| | | |
|---|---|---|
| *C30B 23/04* | (2006.01) | |
| *C30B 11/12* | (2006.01) | |
| *C30B 23/00* | (2006.01) | |
| *C30B 25/00* | (2006.01) | |
| *C30B 29/40* | (2006.01) | |
| *C30B 29/44* | (2006.01) | |
| *C30B 29/60* | (2006.01) | |

(52) U.S. Cl.
CPC ............. *C30B 11/12* (2013.01); *C30B 23/007* (2013.01); *C30B 25/005* (2013.01); *C30B 29/40* (2013.01); *C30B 29/44* (2013.01); *C30B 29/605* (2013.01)

(58) Field of Classification Search
CPC ............................ C30B 23/007; C30B 23/04
See application file for complete search history.

(56) References Cited

U.S. PATENT DOCUMENTS

| | | | | |
|---|---|---|---|---|
| 7,825,032 B2 * | 11/2010 | Bakkers | ................ | B82Y 10/00 257/E21.214 |
| 2009/0252136 A1 * | 10/2009 | Mahany | ................. | H04B 1/707 370/338 |
| 2010/0151661 A1 * | 6/2010 | Samuelson | ............ | B82Y 20/00 438/478 |

OTHER PUBLICATIONS

Belabbes et al., "Electronic bands of III-V semiconductor polytypes and their alignment", Aug. 27, 2012, 075208-1 to 075208-12, Physical Review B v86.
Borgstrom et al., "In situ etching for total control over axial and radial nanowire growth", 2010, 264-270, Nano Research v3.
Yeh et al., "Relationships between the band gaps of the zinc-blende and wurtzite modification of semiconductors", 1994, 2715-2718, Physical Review B v50n4.
De et al., "Predicted band structure of III-V semiconductors in the wurtzite phase", 2010, 155210-1 to 155210-13, Physical Review B v81.

* cited by examiner

*Primary Examiner* — Robert M Kunemund
(74) *Attorney, Agent, or Firm* — Lumen Patent Firm (57) ABSTRACT

Growth of GaP and III-V GaP alloys in the wurtzite crystal structure by vapor phase epitaxy (VPE) is provided. Such material has a direct band gap and is therefore much more useful for optoelectronic devices than conventional GaP and GaP alloys having the zincblende crystal structure and having an indirect band gap.

18 Claims, 10 Drawing Sheets

DIRECT BAND GAP WURTZITE SEMICONDUCTOR NANOWIRES

CROSS REFERENCE TO RELATED APPLICATIONS

This application claims the benefit of U.S. provisional patent application 61/766,421, filed on Feb. 19, 2013, and hereby incorporated by reference in its entirety.

FIELD OF THE INVENTION

This invention relates to epitaxial growth.

BACKGROUND

Although a wide variety of crystal structures are known in nature, any specific material usually has a single preferred crystal structure in which it can be grown. In some cases, it would be desirable to have control over the crystal structure of a grown material, as opposed to being limited to a single fixed crystal structure. For example, gallium phosphide (GaP) normally crystallizes in the zincblende crystal structure. The zincblende crystal structure is one of the crystal structures included in the cubic system of crystal structures. Unfortunately, zincblende GaP has an indirect band gap, which limits its utility for optoelectronic device applications.

Theoretical predictions from band structure calculations suggest that GaP would have a direct band gap if it were to crystallize in the wurtzite crystal structure. The wurtzite crystal structure is one of the crystal structures included in the hexagonal system of crystal structures. Gallium phosphide having a direct band gap would be useful for various optoelectronic device applications. However, to date there has been no report of growth of GaP in the wurtzite crystal structure with a direct band gap. Accordingly, it would be an advance in the art to provide growth of wurtzite GaP having a direct band gap.

SUMMARY

We have fabricated wurtzite GaP and experimentally found that it has a direct band gap, consistent with the above-referenced band structure calculations. We have demonstrated that wurtzite GaP has a direct band gap at a wavelength of 594 nm at 4K. By adding either aluminium or arsenic we have shown that we can tune the emission wavelength across a large region of the visible light spectrum.

Any application that needs a direct band gap semiconductor having a band gap in the accessible range of direct gap wurtzite GaP (or its alloys with Al and/or In and/or As and/or N) can benefit. This may solve the efficiency gap for LEDs, and might form the basis for a visible light emitting green/amber laser. A high efficiency wurtzite GaP LED can be combined with red and blue emitting LEDs for the generation of white light. These wurtzite semiconductor nanowires might also become important for efficient photoelectrocatalytic water splitting into $H_2$ and $O_2$, for solar driven $CO_2$ reduction into solar fuels, or as a high band gap cell within a multi-junction solar cell.

One application of particular interest is for light emitting diodes, where direct gap GaP promises efficient emission in the green part of the spectrum. White light-emitting diodes (LEDS) have a limited efficiency due to a lack of semiconductor materials which can efficiently emit green light. There are only a few semiconductors with a band gap energy corresponding to green light, each having a specific fundamental problem. The issue for ternary III-N compound semiconductors is phase segregation between GaN and InN due to their large lattice mismatch. The issue for the II-VI class materials (like CdS and ZnTe) is control of impurity doping. The issue for conventional (i.e., cubic) GaP is the indirect nature of the band gap (which reduces efficiency). The external quantum efficiency (EQE) of green emitting LEDs is around 10%, and the current best solution is to use phosphors to convert blue/UV light into green. But energy is lost when converting high-energy into lower-energy photons, due to the Stokes shift, and the resulting EQE in the green is limited. Direct gap GaP as provided herein can address this need.

There are other noteworthy applications of wurtzite GaP and its alloys.

1) For solar driven photoelectrocatalytic reduction of water into hydrogen or $CO_2$ into a solar fuel, a direct band gap nanowire electrode is required with a band gap in the range 1.6-2.2 eV. Conventional semiconductors have a Zincblende crystal structure and have an indirect band gap in this spectral range, which makes them unsuited for the absorption of visible solar light.

2) In multi-junction solar cells, a direct band gap non-nitride semiconductor material with a larger band gap than InGaP is desirable, and not conventionally available.

An exemplary embodiment of the invention includes the steps of 1) providing vapor phase epitaxy (VPE) precursors for a first composition including a Gallium (Ga) precursor as a group III species and a Phosphorus (P) precursor as a group V species, and 2) performing VPE of the first composition having a hexagonal crystal structure with a direct band gap. The first composition can be undoped or it can include one or more doping impurities. Such doping can be used to fabricate useful structures/devices, such as p-n junctions.

The VPE can include growth of nanowires of the first composition using the VPE precursors. Such growth of nanowires can include performing vapor-liquid-solid (VLS) growth of nanowires of the first composition. The vapor-liquid-solid method (VLS) is a mechanism for the growth of semiconductor structures, such as nanowires, from a Vapor Phase Epitaxy (VPE) technique. Here VPE is defined to include any vapor deposition technique or any molecular beam deposition technique that provides single-crystal (i.e., epitaxial) grown material, including but not limited to Metal Organic Chemical Vapor Deposition (MOCVD), Molecular Beam Epitaxy (MBE), Chemical Beam Epitaxy (CBE) and Metal Organic Molecular beam Epitaxy (MOMBE). The growth of a crystal through direct adsorption of a gas phase on to a solid surface is generally very slow. The VLS mechanism circumvents this by introducing a catalytic liquid alloy phase which can rapidly adsorb a vapor to supersaturation levels, and from which crystal growth can subsequently occur from nucleated seeds at the liquid-solid interface. The physical characteristics of nanowires grown in this manner depend, in a controllable way, upon the size and physical properties of the liquid alloy.

The VLS growth can be performed using metal nanoparticles (e.g., gold nanoparticles) as a liquid growth catalyst. As described below, it is preferred for the VLS growth to be performed in the presence of a hydrogen chloride gas flow to suppress radial overgrowth of the nanowires. Such suppression of radial overgrowth is attributed to in situ etching by the HCl.

This approach is suitable for growth of any III-V composition including Ga as one of the group III species and P as one of the group V species. Examples include, but are not limited to: GaP, $GaAs_yP_{1-y}$, $In_xGa_{1-x}P$, $GaP_yN_{1-y}$, $Al_xGa_{1-x}P$, and alloys or mixtures of these. More generally in ternary or quaternary III-V compositions, the group III species can include Al and/or In in addition to Ga, and the group V species can include As and/or N in addition to P.

Core-shell nanowires can be grown via the present approach, in which the crystal structure of the core is directly transferred into the shell. For example, wurtzite nanowires of a first III-V composition can be grown as described herein (e.g., using a VLS approach) and then a second composition (different from the first composition) can be grown on the first composition, which has the same wurtzite crystal structure as the first composition. Any growth technique can be used for growth of the second composition, e.g., a vapor-solid (VS) method. The resulting structure will have a core of the first composition and a shell of the second composition with the crystal structure of the first composition.

As indicated below, it is preferred for growth temperatures to be relatively high in this work. For most of the VLS growth (other than during an initial nucleation step described below) the thermocouple temperature is preferably between about 600° C. and 900° C., and is more preferably between about 700° C. and 780° C. The corresponding in situ substrate temperature is preferably between about 515° C. and 776° C. and is more preferably between about 603° C. and 671° C. The relation between thermocouple temperature and substrate temperature is described below in connection with FIG. 8. When considering application of this work to other growth techniques and/or to other makes or models of VPE reactors, the substrate temperature should be used, and then converted to the thermocouple temperature (or equivalent growth parameter) of the other growth system if/as needed.

Preferably VLS nanowire growth includes an initial nucleation step at relatively low temperatures. Preferably, the thermocouple temperature for this step is between about 460° C. and 520° C. (corresponding to a preferred substrate temperature range between about 395° C. and 446° C.).

Any kind of growth substrate can be employed in practicing the invention. Suitable substrates include but are not limited to: silicon substrates and III-V substrates. A striking demonstration of this technology is given in the experimental work described below, where wurtzite (i.e., hexagonal crystal structure) GaP nanowires are grown with high quality on a zincblende (i.e., cubic crystal structure) GaP substrate. In conventional growth techniques, one expects the crystal structure of the grown material to match that of the substrate because the substrate usually serves as the template for crystal growth. Thus, one would expect a cubic GaP substrate to give rise to cubic GaP nanowires. High temperature VLS-growth allows one to provide GaP nanowires having a hexagonal crystal structure on a GaP substrate having a cubic crystal structure. The substrate can have any orientation (e.g., (111), (110) or (100) orientation).

As indicated above, this work is broadly applicable. Any kind of optoelectronic device can include direct-gap wurtzite GaP (or wurtzite GaP alloy) material as described above. Such devices include, but are not limited to: light emitting diodes, semiconductor lasers, single photon emitters, solar cells, single junction solar cells, multi-junction solar cells, photoelectrochemical cells, and solar-driven photoelectrocatalytic devices.

DETAILED DESCRIPTION

1) Introduction

Widely used semiconductors like germanium (Ge) and gallium phosphide (GaP) have an indirect band gap for the normal cubic (diamond or zinc blende) crystal structure, severely limiting their use for light-emitting devices. Band structure calculations, however, predict a direct band gap for these materials when they have the hexagonal (wurtzite) crystal structure. A unique feature of the vapor-liquid-solid (VLS) nanowire growth mechanism is that well-known semiconductors can be grown with different crystal structures. The calculated direct band gap energy for wurtzite GaP ranges between 2.18-2.25 eV, and therefore is a promising candidate for light emission in the green-yellow region of the visible spectrum. Similarly, the band gap of Aluminum Phosphide (AlP) is predicted to change from indirect to direct when the structure is converted from cubic to hexagonal with gap energy of 2.97 eV. Therefore, by forming ternary $Al_xGa_{1-x}P$ and $GaAs_yP_{1-y}$ compounds, the emission wavelength can theoretically be tuned over a wide range. The transition from indirect to a direct band gap by changing from zinc blende to wurtzite has not yet been demonstrated experimentally for any material at ambient pressure conditions.

2) Experimental Results

For this study, GaP nanowires are grown on (111) oriented zinc blende GaP substrates using the VLS mechanism and patterned gold islands as catalysts at a growth temperature of 750° C. and low V/III ratio to promote the formation of the wurtzite crystalline structure. In order to control the nanowire position two lithography techniques are used; electron beam lithography to fabricate small arrays with varying pitch and diameter, and nanoimprint to pattern large-scale areas with a constant pitch and diameter.

Figure 1A:
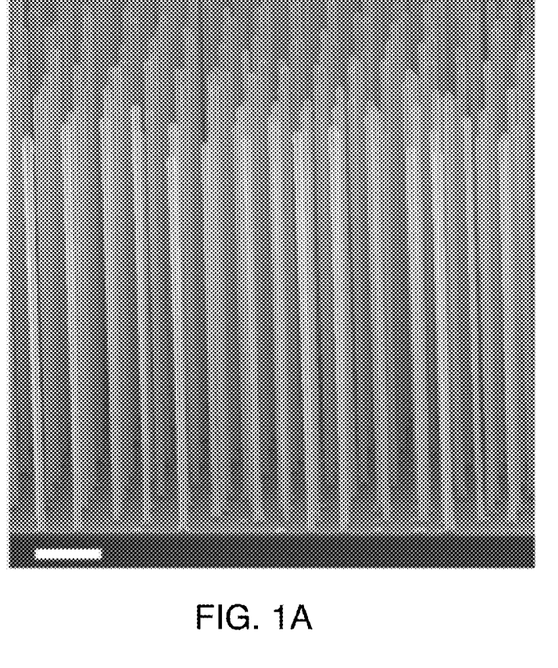
FIGS. 1A-C show images of fabricated wurtzite GaP nanowires.

The cross sectional scanning electron microscopy (SEM) image in FIG. 1A shows a uniform array of 6.6±0.2 μm long non-tapered $GaP/Al_{0.4}Ga_{0.6}P$ core/shell nanowires with almost 100% yield defined by nanoimprint. Here the tilting angle is 70 degrees and the scale bar corresponds to 1 μm. We note that although the wires are grown at high temperatures (T=750° C.), untapered wires are obtained by the use of HCl during growth as described below.

Figure 1B:
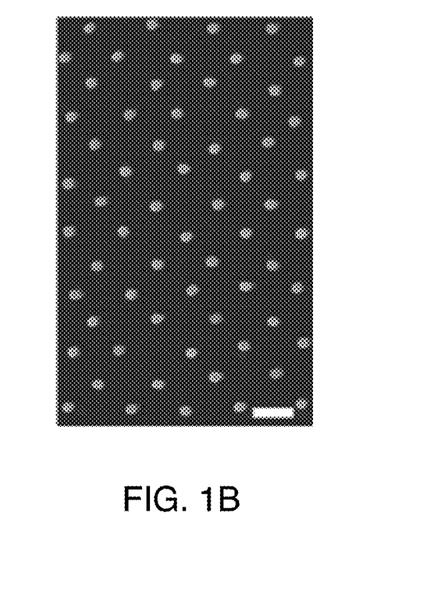

FIG. 1B shows an SEM top-view image of the same sample as in FIG. 1A showing the periodicity of the nanoimprint pattern. Here the scale bar corresponds to 500 nm.

Figure 1C:
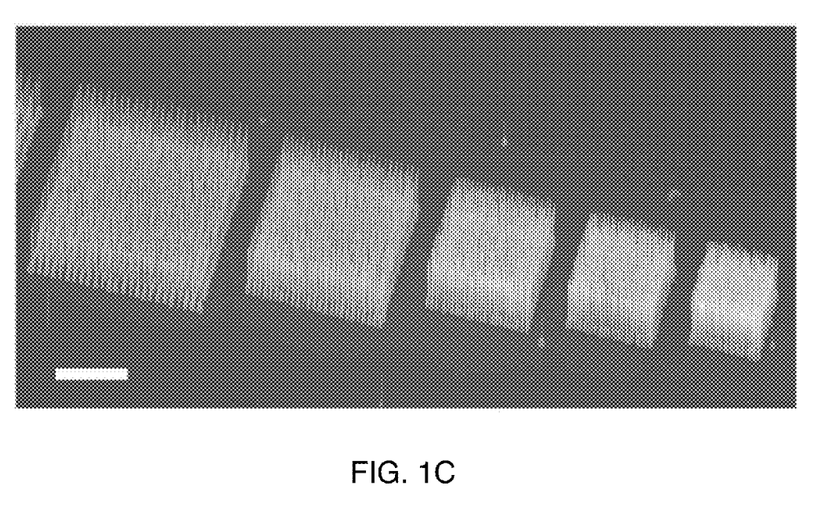

An SEM image of several e-beam defined nanowire arrays is shown in FIG. 1C. Radial growth, which leads to tapered nanowires, has been totally suppressed by using HCl during growth. More specifically, FIG. 1C is an SEM image of GaP/AlGaP core/shell nanowire arrays grown from Au catalysts defined by electron beam lithography with varying pitch (0.4-1.0 μm), but constant diameter of 100 nm (tilting angle 30 degrees). The scale bar corresponds to 10 μm. The small overgrowth which can be seen at the bottom of the nanowires is related to the diffusion of the precursors over the GaP substrate during the shell growth.

Figure 2A:
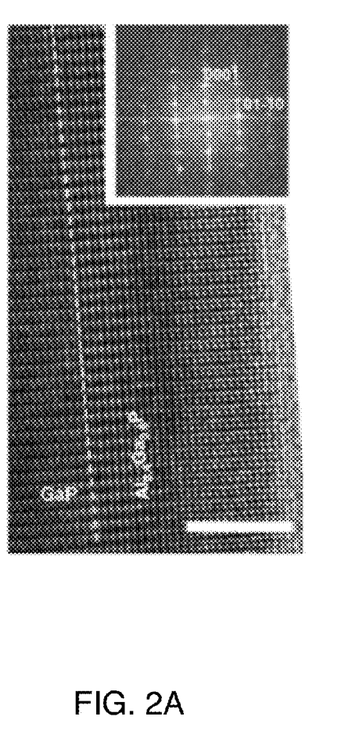
FIGS. 2A-B shows TEM images of a fabricated wurtzite GaP nanowire.

In order to assess the crystal structure of the nanowires, high-resolution transmission electron microscopy (HRTEM) studies are performed. The TEM image in FIG. 2A and the corresponding Fast-Fourier Transform (inset of FIG. 2A) demonstrate the wurtzite crystal structure of the GaP nanowires. The $Al_{0.4}Ga_{0.6}P$ shell lattice matches the core and no defects are nucleated from the interface. The scale bar corresponds to 5 nm.

Figure 2B:
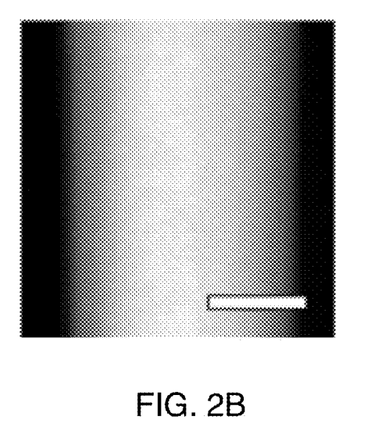

Typically, less than 1 stacking fault per micrometer is observed for the tens of wires studied. A wider band gap ternary AlGaP shell is grown around the GaP core to suppress possible undesirable surface effects, as will be discussed below. Shells are grown under different conditions compared to axial nanowire growth, and the thickness is controlled by the shell growth time and the composition by the Al/Ga gas input ratio. The core/shell structure is visible from the High Angle Annular Dark Field (HAADF) TEM image in FIG. 2B. This image shows the uniformity of the shell. The scale bar corresponds to 50 nm.

Figure 2C:
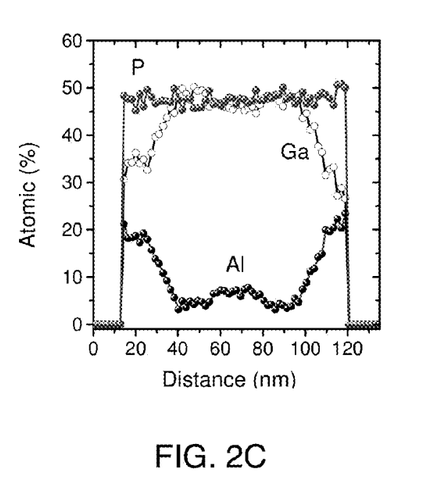
FIG. 2C shows measured composition across the width of a core/shell wurtzite GaP/AlGaP nanowire.

The shell composition and thickness for the different samples have been determined from Energy-Dispersive X-ray (EDX) line scans as shown in FIG. 2C, which is a line scan taken perpendicular to the nanowire axis, showing the $GaP/Al_{0.4}Ga_{0.6}P$ core/shell structure. We observed rotation of the side facets during the AlGaP shell growth. As a result of this, the projected thickness of the shell varies across the nanowire producing a small "bump" in the EDX profile. This particular wire has a 10 nm thick $Al_{0.4}Ga_{0.6}P$ shell. It is important to note that AlGaP is nearly lattice matched to GaP, and as a result no defects are generated in the shell.

Figure 2D:
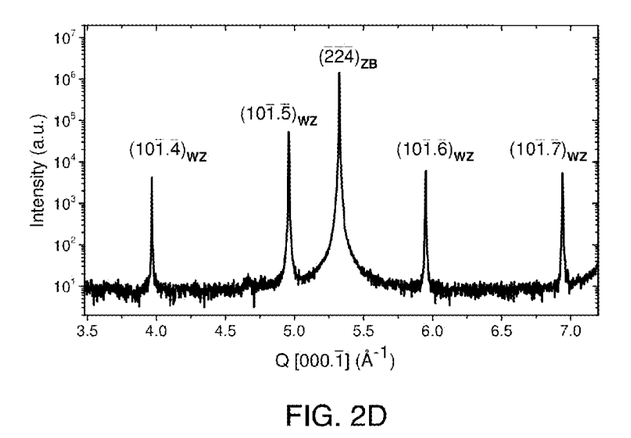
FIG. 2D shows X-ray diffraction results from wurtzite GaP/AlGaP nanowires.

To check the sample quality and to determine the wurtzite lattice parameters, X-ray diffraction measurements are performed on large area nanowire samples patterned by nanoimprint. FIG. 2D shows X-ray diffraction intensity along the crystal truncation rod through the (-2-2-4) substrate peak, which includes the (10-1.-l) wurtzite peaks. In the scan in FIG. 2D the (10-1.-l) peak series for the WZ wires and the (-2-2-4) ZB substrate peak are observed, while no extra peaks from polytype structures (ZB, 4H, 6C) are found. This together with the narrow line width of the WZ peaks, which is limited by the resolution of the set-up, shows the high crystalline quality of the sample. The measured a- and c-lattice parameters for the WZ unit cell are respectively, 3.842 Å and 6.335 Å, which differ from the values when the ZB parameters are geometrically converted into the WZ unit cell. In the wires the WZ unit cell is elongated along the growth (c-) axis and compressed in the in-plane direction along the a-axes similar to what is found for the WZ phase of other III-V nanowires. This increase of the c/a ratio, which measures the hexagonal crystal field, is in agreement with the results of density functional theory (DFT) calculations within the local density approximation (LDA). Based on these experimental lattice values the electronic band structure is calculated by DFT with the LDA-1/2 method taking quasi-particle corrections and spin-orbit interaction into account. The lowest predicted conduction to valence band transition, $\Gamma_{9v} \rightarrow \Gamma_{8c}$, corresponds to a band gap value of 2.12 eV.

In order to verify the direct nature of the band gap of WZ GaP, the wires are studied with low-temperature microphotoluminescence (PL). For this, e-beam defined nanowire array samples are used with a wire-to-wire spacing of 1.0 micrometer. The emission intensity and radiative lifetime of the WZ nanowires are compared with a ZB (001) bulk GaP sample as a reference.

Figure 3A:
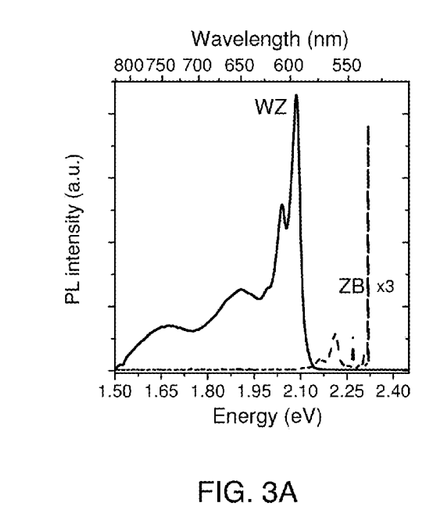
FIGS. 3A-D show 4K photoluminescence (PL) results from wurtzite GaP/AlGaP nanowires.

FIG. 3A shows photoluminescence spectra of a ZB (100) GaP substrate (dashed line) and of WZ $GaP/Al_{0.4}Ga_{0.6}P$ nanowires (solid line). For both spectra an excitation wavelength of 405 nm at a power of 0.6 W/cm$^2$ is used. The PL spectrum of the ZB GaP substrate in FIG. 3A exhibits two main peaks at 2.317 and 2.268 eV, corresponding to the A-line, which originates from excitonic emission from isoelectronic nitrogen impurities on P lattice sites, and its phonon-replica. The vertical $GaP/Al_{0.4}Ga_{0.6}P$ core/shell nanowires show the strongest emission at 2.09 eV (=594 nm) with a full width at half maximum (FWHM) of 29 meV, together with a wider and less intense peak at 2.04 eV (=607 nm) with a FWHM of 53 meV and two broad emissions at 1.91 and 1.65 eV. Bare vertical WZ GaP nanowires show identical PL spectra, only with slightly lower intensity. Horizontal oriented nanowires also show emission between 550 and 560 nm at higher excitation density (not shown). To ensure that the emission of the vertical nanowires originates from the wires and not from the substrate, nanowires are transferred from a substrate patterned by nano-imprint, into a PDMS (polydimethylsiloxane) film coated with a titanium/gold back mirror, yielding similar results. The peak at 2.09 eV agrees with the lowest inter-band transition, $\Gamma_{9v} \rightarrow \Gamma_{8c}$, predicted at a value of 2.12 eV. It is known that nitrogen can induce direct transitions in GaP. Since we can exclude any possible source of atomic nitrogen in our reactor we can rule out nitrogen related direct emission from the nanowires. The peak at 2.04 eV most probably corresponds to a transition from the conduction band to a carbon acceptor level. We assign the broad band at 1.91 eV to type II ZB/WZ junctions, resulting from the few stacking faults in our samples, which is supported by the theoretically predicted valence band offset of 0.14 eV between ZB and WZ, and the band at 1.65 eV to incorporated impurities.

The integrated PL intensity of the peak at 2.09 eV shows a linear dependence on the excitation power density with a saturation of the curve observed at high excitation powers. The slope of a fitted power law dependence ($I \propto P^k$) is 0.8-1.0, indicating that the PL emission is due to excitonic recombination. The exciton binding energy is obtained from temperature-dependent PL measurements and is 11±4 meV. The energy gap at T=0 K is extracted to be between 2.09 and 2.11 eV.

Figure 3B:
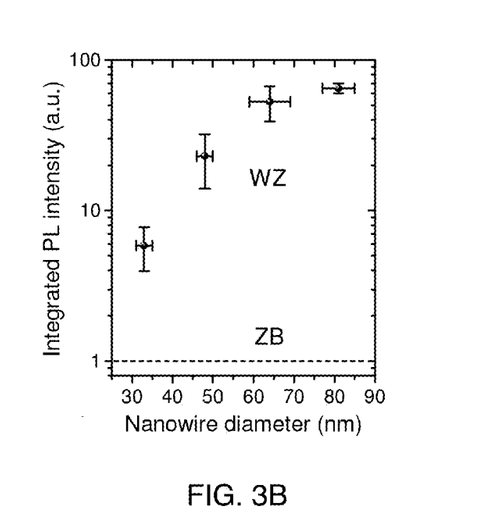

The spectra in FIG. 3A are obtained under identical experimental conditions so that we can quantitatively compare the PL intensity of the WZ wires and that of the ZB substrate. In FIG. 3B the integrated PL emission of the main ZB peak at 2.317 eV (dashed line) is compared to that of the main WZ wire peak at 2.09 eV (data points) for different nanowire core diameters. The WZ PL intensity increases with wire diameter, due to increased volume, and levels off at the largest diameters. It is important to note that the integrated PL emission of WZ wires (80 nm diameter) is 65 times higher than that of the ZB GaP(001) substrate. This represents a lower limit of the enhancement factor of the WZ PL intensity, since this value is not corrected for the probed materials volume. Note that the wires cover less than 1% of the surface area, and moreover, the in and out coupling of light from the microscope objective is much better for a planar substrate compared to vertical nanowires. We have used a high quality ZB GaP(001) substrate as a reference, since the phonon assisted band-to-band emission of a GaP (111) substrate, observed at 2.28 eV at higher excitation power, is below the detection limit under these measurement conditions. The high emission intensity, the excitonic nature of the emission together with the very good agreement between the experimental and predicted WZ GaP band gap values, strongly suggest the presence of direct band gap transitions in the WZ GaP nanowires.

Figure 3C:
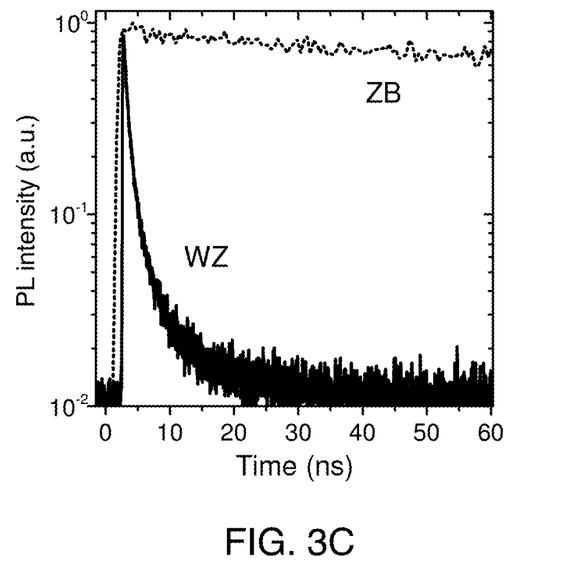

To further substantiate the direct nature of the band gap, we perform time-resolved PL measurements on WZ GaP/$Al_{0.4}Ga_{0.6}P$ core/shell nanowires as well as on ZB bulk GaP (FIG. 3C). A long lifetime of 254±3 ns is obtained for the A-line of the ZB bulk GaP, which is in the typical range for an indirect band gap transition. In strong contrast, a lifetime of 0.78±0.01 ns is observed for the WZ core/shell nanowires, which compares favorably to lifetimes reported for direct band gap semiconductor like GaAs. The striking difference in lifetimes marks the transition from indirect to direct band gap material by transforming the crystal structure from ZB to WZ.

Figure 3D:
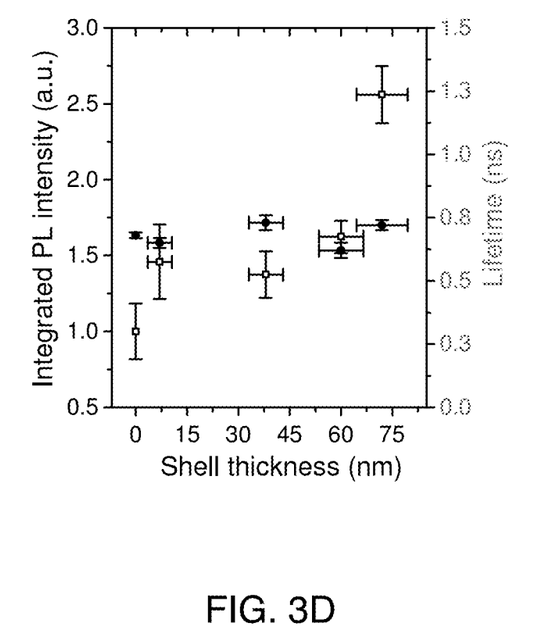

In order to rule out any surface-related decay process, we have studied the PL intensity and lifetime of core/shell nanowires as a function of the $Al_{0.4}Ga_{0.6}P$ shell thickness. On FIG. 3D, the solid symbols relate to lifetime (right vertical axis), and the open symbols relate to integrated PL intensity (left axis). FIG. 3D shows that a thin shell (7 nm) increases the PL intensity by a factor of 1.5, but increasing the shell thickness further (up to 60 nm) has no major effect on the intensity. The small increase of the intensity indicates that surface states have only a minor effect on the optical properties of the wires. The intensity increase for the thickest shell of 72 nm is explained by enhanced absorption/emission of the wire, since the lifetime is unaffected. The temporal evolution of the PL intensity is independent of the shell thickness and the decay time is around 0.8 ns for all samples.

Figure 4A:
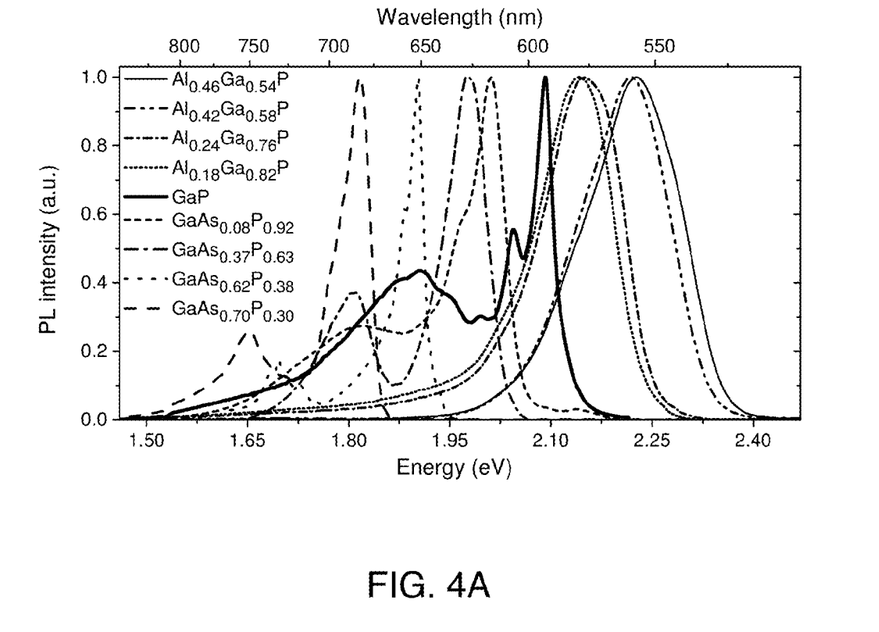
FIGS. 4A-C show 4K PL results relating to AlGaP and GaAsP wurtzite nanowires having various compositions.
Figure 4B:
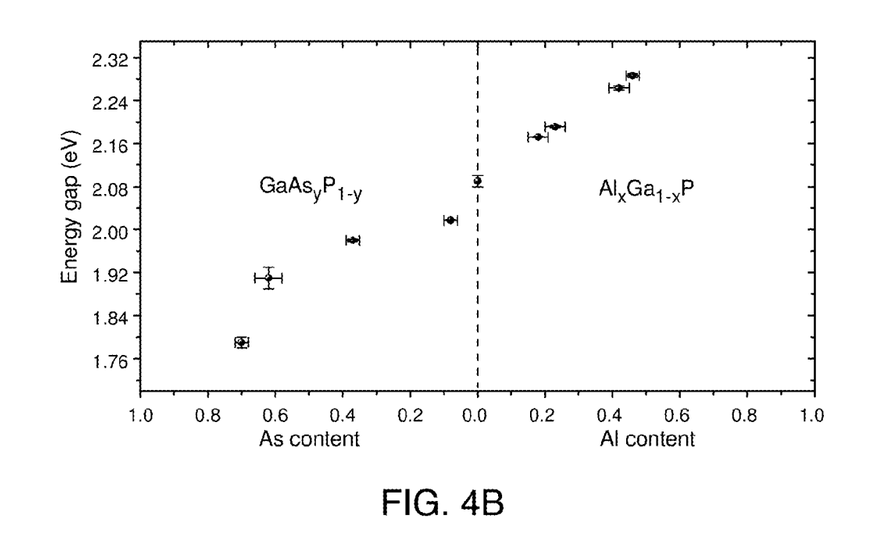

To address the emission tunability across a significant portion of the visible range, WZ $Al_xGa_{1-x}P$ and $GaAs_yP_{1-y}$ ternary compound nanowires are grown. In FIG. 4A emission spectra of ternary compounds with different compositions are shown. Partial substitution of Ga by Al induces a blue-shift of the emission down to 555 nm with an Al concentration of 46%, while substitution of P by As induces a red-shift of the emission up to 690 nm with an As concentration of 70%, demonstrating that the emission color can be adjusted for a range of wavelengths, which is important for solid state lighting. FIG. 4B shows the energy at the emission maxima as a function of the nanowire composition.

Figure 4C:
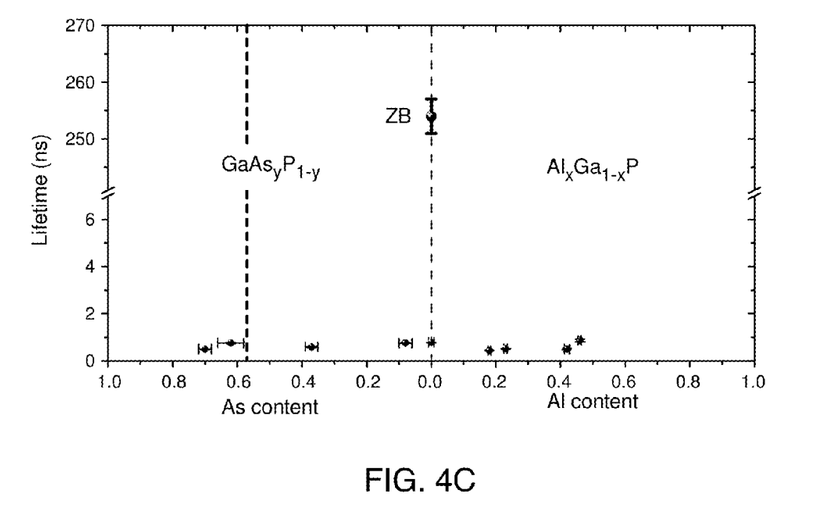

FIG. 4C shows measured radiative lifetimes as a function of the different wurtzite $Al_xGa_{1-x}P$ and $GaAs_yP_{1-y}$ compositions (data points). The ZB GaP substrate lifetime is at 254 ns. The dotted line at 57% As indicates the direct/indirect transition for zinc blende GaAsP material. FIG. 4C shows that the lifetime is between 0.5 and 1 ns for all WZ nanowire samples. It is important to mention that the emission intensity and lifetime of $GaAs_yP_{1-y}$ ternary nanowires are independent on the As composition, unlike in the case of bulk ZB $GaAs_yP_{1-y}$, which has a direct/indirect energy gap crossover point at a composition of y=0.57. This confirms that these wurtzite ternary nanowires preserve the direct nature of the band structure over the whole compositional range.

Figure 5A:
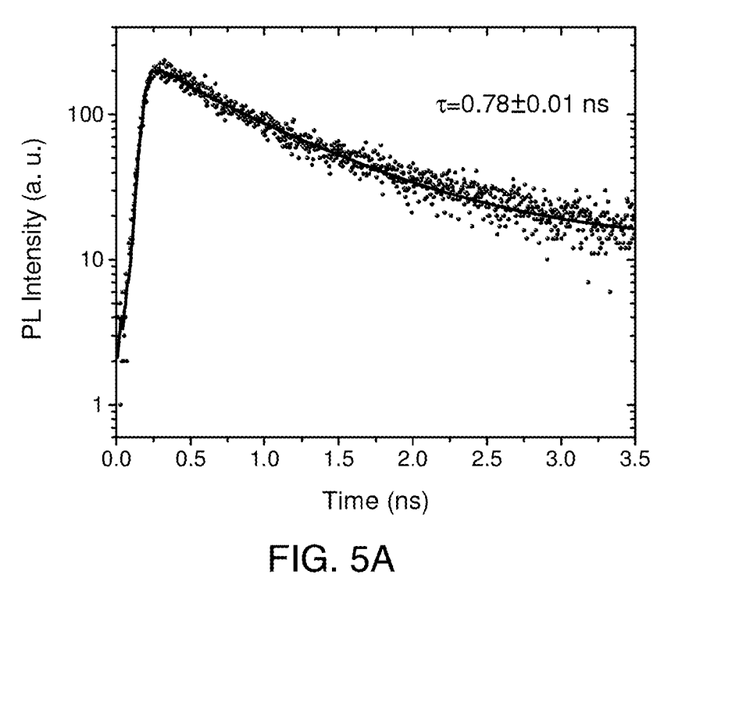
FIGS. 5A-B show time-resolved PL and curve fits for direct gap PL from the wurtzite nanowires and from indirect gap PL from the cubic GaP substrate.
Figure 5B:
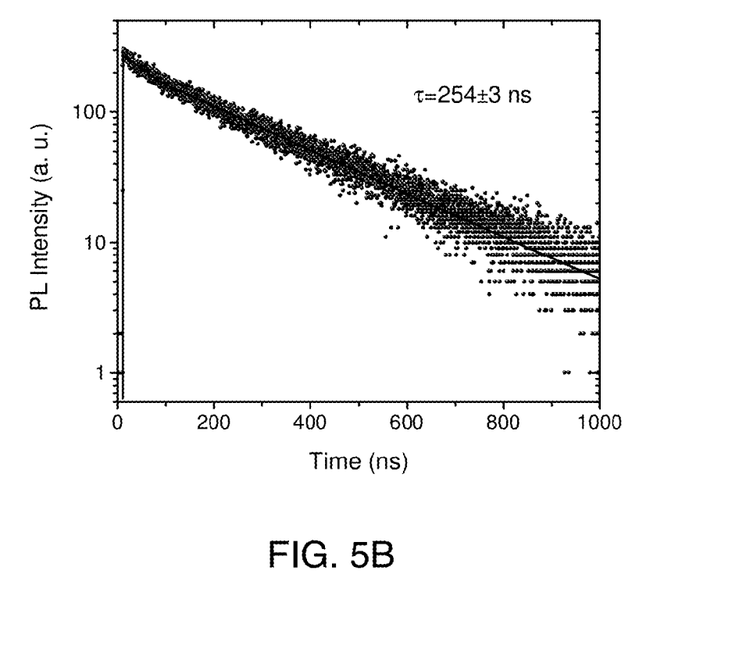

FIG. 5A shows time-resolved PL measurement of the GaP/$Al_{0.4}Ga_{0.6}P$ nanowires. FIG. 5B shows time-resolved PL measurement of the ZB GaP substrate. Note the different time scales. The curve fits shown on FIGS. 5A-B give a decay time of 0.78 ns for the wurtzite GaP nanowires, and 254 ns for the zinc-blende GaP substrate. This difference marks the difference between the direct and indirect band gap for the different crystal structures.

Figure 6:
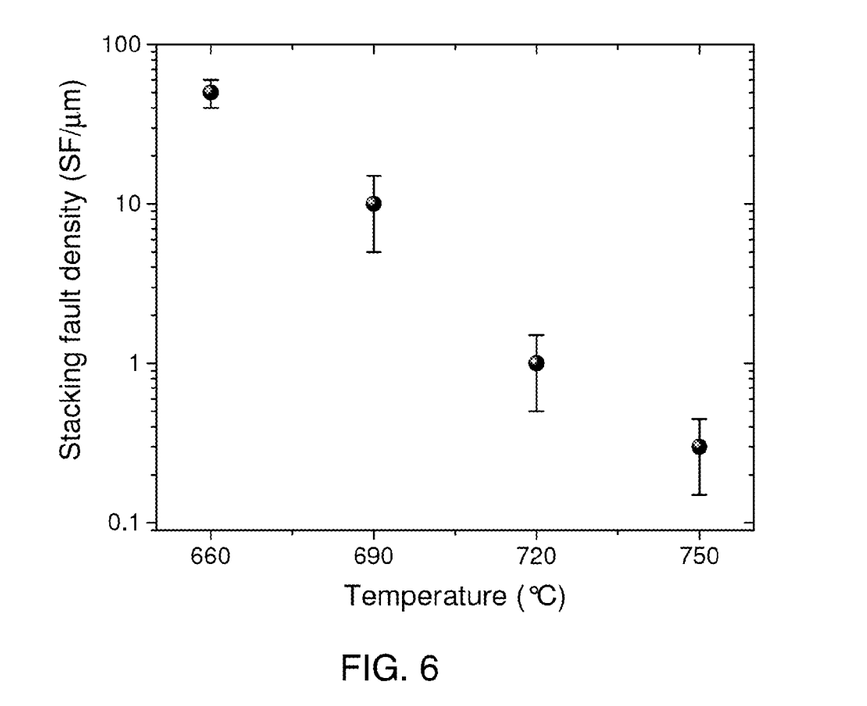
FIG. 6 shows stacking fault density in wurtzite nanowires vs. the thermocouple growth temperature.

FIG. 6 shows measured stacking fault density as a function of thermocouple growth temperature. From this result, it is apparent that high growth temperatures are preferred to reduce the density of these undesirable stacking fault defects.

Figure 7:
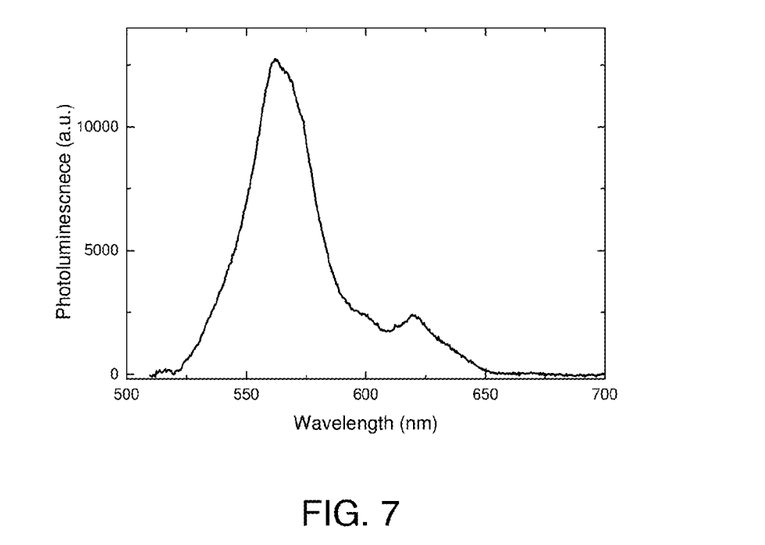
FIG. 7 shows room temperature PL from a wurtzite nanowire.

FIG. 7 shows measured room temperature PL emission of a GaP/AlGaP core/shell nanowire with 200 nm GaP core. The band gap emission is centered at 565 nm.

Figure 8:
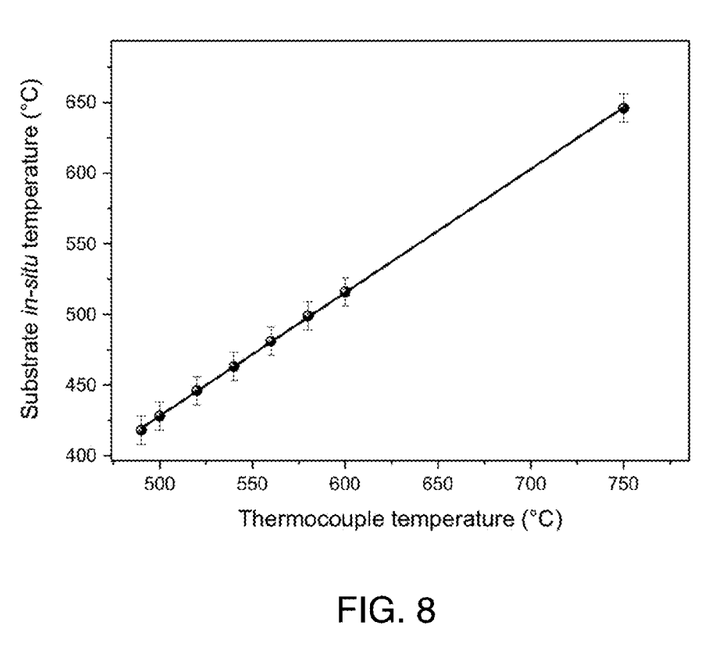
FIG. 8 shows a calibration curve relating substrate temperature to thermocouple temperature for the vapor phase epitaxy reactor used in this work.

It is important to note that all growth temperatures given above are thermocouple temperatures, defined in this work as being the temperature measured below the susceptor in the VPE reactor by a thermocouple. The thermocouple temperatures measured in our MOVPE machine can be converted into the actual (in-situ) substrate temperature according to the calibration curve of FIG. 8. Here the actual (in-situ) substrate temperature is measured on silicon dummy substrates by an ARGUS pyrometer system. Since thermocouple temperatures and substrate temperatures can differ significantly, it is often preferred to define growth recipes in terms of substrate temperature. Methods for performing temperature calibrations of the kind shown in FIG. 8 are also known in the art for other VPE approaches.

3) Methods and Materials 3.1) Nanowire Growth.

The wurtzite nanowires were grown in a low-pressure (50 mbar) Aixtron CCS-MOVPE reactor using gold nanoparticles as catalyst for the VLS growth. The gold droplets were deposited over the zinc blende GaP $(111)_B$ substrates using the nanoimprint technique (100 nm diameter/500 nm pitch), or by e-beam lithography to define square arrays with different droplet diameters/pitches (25 nm-100 nm diameter, 200 nm-5 μm pitch). Prior to growth the GaP patterned substrates were annealed under a Phosphine ($PH_3$) flow at 750° C. to remove the oxide on the surface and the organic residuals of the lithographic steps. Tri-Methyl Gallium (TMG) and Phosphine ($PH_3$) were used as precursor gases for the nanowire growth, with a total flow of 8.2 liters/minute using hydrogen as carrier gas.

A nucleation step at 490 C for 30 s using TMG and $PH_3$ (molar fraction $6.7 \times 10^{-5}$ and $1.1 \times 10^{-2}$, respectively) was used, and is preferred to achieve high yield of the nanowires. A V/III ratio of 163 was used for the nucleation step.

The nanoimprint and e-beam patterned samples were grown at 750° C. for, respectively, 45 min and 20 min using TMG and $PH_3$ at molar fractions of $7.4 \times 10^{-5}$ and $1.7 \times 10^{-3}$, respectively. A V/III ratio of 23 was used. The 750 C growth was performed under Hydrogen Chloride gas (HCl) flow (molar fraction $1.2 \times 10^{-4}$) to suppress the radial overgrowth of the wires[11].

For the growth of $Al_xGa_{1-x}P$ and $GaAs_yP_{1-y}$ nanowires Tri-Methyl Aluminum (TMAl) and Arsine ($AsH_3$) were used, with molar fractions up to $1.0 \times 10^{-6}$ and $3.5 \times 10^{-6}$, respectively. The growth of the $Al_{0.4}Ga_{0.6}P$ shell was performed at 690° C. for 4 min (nanoimprint) and 20-240 s (e-beam sample) using TMG, TMAl and $PH_3$ as precursor gases at molar fractions of $2.7\times10^{-5}$, $1.5\times10^{-5}$ and $1.1\times10^{-2}$, respectively.

3.2) SEM and TEM Analysis.

The SEM pictures were taken with a Zeiss Sigma microscope. The samples were analyzed using an FEI Tecnai Transmission Electron Microscope, operated at 300 kV, in bright field, high resolution T and High Angle Annular Dark Field/Scanning TEM (HAADF/STEM) modes.

3.3) Optical Measurements.

The micro-PL spectra and PL-lifetime data were collected in backscattering geometry on e-beam patterned arrays of vertical nanowires, using a NA=0.7 Nikon 50×CR objective featuring a 1.0 μm spot size at the sample. For PL measurements, the sample was excited by a 405 nm CW laser diode. PL-lifetime was measured by using time correlated single photon counting with 130 ps instrumental resolution. Here, the sample was excited by a 441 nm pulsed diode with 100 kHz and 2 MHz repetition rate for measurements of the ZB substrate and the WZ nanowires, respectively. The data points in FIGS. 3B,D and 4B-C are averages and standard deviations extracted from several measurements (at least 3) collected from different positions on the nanowire arrays and also on nanowire arrays with periodicity ranging from 500 nm to 5 μm. All PL measurements for FIGS. 3A-D and 4A-C were performed at 4 K.

4) CONCLUSION

We have demonstrated the conversion of indirect band gap semiconductors into direct semiconductors by tailoring the crystal structure. This approach is shown here for GaP and AlP, and by transferring the crystal structure epitaxially it can be tested for a variety of other materials. It opens new routes to tune the optical properties of well-established materials with inherent applications. Wurtzite GaP may help to bridge the green gap and increase the efficiency of white light-emitting diodes (LEDs)[3]. Currently, these devices have a limited efficiency due to a lack of semiconductor materials, which can efficiently emit green light. There are only few semiconductors with a band gap energy corresponding to green light, and each of these has a specific fundamental problem. The external quantum efficiency (EQE) of green emitting LEDs is around 10%, and the current best solution is to use phosphors to convert blue/UV light into green. In addition to this application, GaP and AlP have a small lattice mismatch with Si and wurtzite GaP hence facilitates the epitaxial integration of photonic materials into silicon technology with a high-quality hetero interface.

The invention claimed is:

1. A method for wurtzite semiconductor growth, the method comprising:
   providing vapor phase epitaxy (VPE) precursors for a first composition including a Gallium (Ga) precursor as a group III species and a Phosphorus (P) precursor as a group V species;
   performing VPE of the first composition having a hexagonal crystal structure with a direct band gap.

2. The method of claim 1, wherein the VPE comprises growth of nanowires of the first composition using the VPE precursors.

3. The method of claim 2, wherein the growth of nanowires comprises performing vapor-liquid-solid (VLS) growth of nanowires of the first composition.

4. The method of claim 3, wherein the VLS growth is performed using metal nanoparticles as a liquid growth catalyst.

5. The method of claim 3, wherein the VLS growth is performed in the presence of a hydrogen chloride gas flow to suppress radial overgrowth of the nanowires.

6. The method of claim 3, wherein the VLS growth is substantially performed at a thermocouple temperature between about 600° C. and 900° C.

7. The method of claim 6, wherein the VLS growth is substantially performed at a thermocouple temperature between about 700° C. and 780° C.

8. The method of claim 3, wherein the VLS growth comprises performing an initial nucleation step at a thermocouple temperature between about 460° C. and 520° C.

9. The method of claim 3, wherein the VLS growth is substantially performed at a substrate temperature between about 515° C. and 776° C.

10. The method of claim 9, wherein the VLS growth is substantially performed at a substrate temperature between about 603° C. and 671° C.

11. The method of claim 3, wherein the VLS growth comprises performing an initial nucleation step at a substrate temperature between about 395° C. and 446° C.

12. The method of claim 1, wherein the first composition is a composition selected from the group consisting of: GaP, $GaAs_yP_{1-y}$, $In_xGa_{1-x}P$, $GaP_yN_{1-y}$, $Al_xGa_{1-x}P$, $In_xGa_{1-x}P_yN_{1-y}$, $Al_xGa_{1-x}P_yN_{1-y}$, $GaP_{1-x}As_yN_{1-x-y}$, and alloys or mixtures thereof.

13. The method of claim 3, further comprising growing a second composition on the nanowires by a VS (vapor-solid) growth method to provide a nanowire structure having a core of the first composition and a shell of the second composition, wherein the second composition has the same crystal structure as the first composition.

14. The method of claim 1, wherein a substrate for the VLS growth is a substrate selected from the group consisting of: silicon substrates and III-V semiconductor substrates.

15. The method of claim 14, wherein the substrate has a (111), (110) or (100) orientation.

16. The method of claim 1, wherein the first composition includes doping impurities.

17. A method of making an optoelectronic device, the method comprising fabricating an optoelectronic device including a wurtzite direct gap III-V active region;
   wherein the wurtzite III-V active region includes a III-V composition including Gallium (Ga) as a group III species and Phosphorus (P) as a group V species; and
   wherein the III-V composition is fabricated according to the method of claim 1.

18. The method of claim 17, wherein the optoelectronic device is selected from the group consisting of: light emitting diodes, semiconductor lasers, single photon emitters, solar cells, single junction solar cells, multi-junction solar cells, photoelectrochemical cells, and solar-driven photoelectrocatalytic devices.

* * * * *